United States Patent
Reese

(10) Patent No.: US 7,343,387 B2
(45) Date of Patent: Mar. 11, 2008

(54) ALGORITHM FOR CONFIGURING CLOCKING SYSTEM

(75) Inventor: Gilbert R. Reese, Boston, MA (US)

(73) Assignee: Teradyne, Inc., North Reading, MA (US)

(*) Notice: Subject to any disclaimer, the term of this patent is extended or adjusted under 35 U.S.C. 154(b) by 1024 days.

(21) Appl. No.: 10/083,325

(22) Filed: Feb. 26, 2002

(65) Prior Publication Data
US 2003/0163497 A1    Aug. 28, 2003

(51) Int. Cl.
G06F 15/00    (2006.01)
G06F 7/52    (2006.01)

(52) U.S. Cl. .................. 708/200; 708/103

(58) Field of Classification Search ........ 708/270–273, 708/103, 200; 377/47–49
See application file for complete search history.

(56) References Cited

U.S. PATENT DOCUMENTS

| | | | | |
|---|---|---|---|---|
| 5,018,170 A | * | 5/1991 | Wilson | .................. 375/376 |
| 5,719,510 A | | 2/1998 | Weidner | |
| 6,107,843 A | * | 8/2000 | de Gouy et al. | .......... 377/48 |
| 6,597,208 B1 | * | 7/2003 | Gabet et al. | .................. 327/105 |

FOREIGN PATENT DOCUMENTS

| | | |
|---|---|---|
| WO | 199402861 A1 | 2/1994 |
| WO | 199628745 A2 | 9/1996 |
| WO | 200128100 A1 | 4/2001 |

OTHER PUBLICATIONS

Mehtani, R., et al.: "Mix Test: A mixed-signal extension to a digital test system" Test Conference, 1993. Proceedings., International Baltiomore, MD, USA Oct. 17-21, 1993, New York, NY, USA, IEEE Oct. 17, 1993.

* cited by examiner

Primary Examiner—Chat C. Do
(74) Attorney, Agent, or Firm—Bruce D. Rubenstein

(57) ABSTRACT

A system and method for configuring an automatic test system to produce a plurality of clocks from a reference clock includes a user interface and software. The user interface receives a plurality of inputs that specify desired frequencies of the plurality of clocks. In response to a command from the user interface, the software calculates values for dividers coupled to the reference clock, for deriving each of the desired frequencies from the reference clock. According to one embodiment, the desired frequencies form ratios that must be met to satisfy coherence. In calculating the divider values, the software minimizes frequency errors while precisely preserving the required ratios.

19 Claims, 9 Drawing Sheets

ALGORITHM FOR CONFIGURING CLOCKING SYSTEM

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to automatic test equipment (ATE) for electronics, and, more particularly, to techniques for programming multiple clocks in an automatic test system.

2. Description of Related Art Including Information Disclosed Under 37 C.F.R. 1.97 and 1.98

ATE systems typically use multiple clocks for testing electronic devices. In a common testing scenario, three or more clocks may be used—for example, a digital clock, a source clock, and a capture clock. The digital clock defines the rate at which digital I/O applies digital signals to the DUT (device under test), or samples digital signals from the DUT. The source clock defines the rate at which an analog source, such as an AWG (arbitrary waveform generator), varies the output levels of analog signals applied to the DUT. The capture clock defines the rate at which a digitizer samples analog signals from the DUT.

Device testing generally requires that different clocks of a test system be coordinated. When testing a DAC (digital-to-analog converter), the digital clock is coordinated with the capture clock to ensure that the digitizer samples the DAC's output at known points referenced to the DAC's input codes. Similarly, when testing an ADC (analog-to-digital converter), the digital clock is coordinated with the source clock to ensure that digital readback from the ADC is referenced to known points along the analog input signal.

It is particularly important to coordinate clocks for achieving "coherence." A signal is coherent when each tone in the signal completes an integer number of cycles within the sample window. Mathematically, coherence is achieved when $F_s/N = F_{ik}/M_k$, where $F_s$ is the instrument's sampling rate;

N is the number of samples in the sample window (sourced or captured);

$F_{ik}$ is the frequency of interest (output or expected) of the $k^{th}$ tone; and $M_k$ is the number of cycles that the $k^{th}$ tone completes within the sample window.

The need for coherence arises when two or more clocks are involved in a single test, for example, when one clock controls the sourcing of an input signal and another clock controls the capture of an output signal that contains the same frequencies as the input signal. Without coordination, it would be impossible to guarantee that $F_s/N = F_{ik}/M_k$, and thus to guarantee coherence.

Coherence is important for preventing "leakage." Leakage is the mathematical consequence of sourcing or sampling truncated tones. Leakage adds harmonic distortion to sourced signals and distorts the DFT's (Discrete Fourier Transforms) of sampled signals. Therefore, leakage impairs a test system's ability to test device characteristics accurately.

Test engineers conventionally apply their knowledge of a test system's clocking system and instruments ascertain clock frequencies manually. Clocking systems and instruments can be extremely complex, however, imposing constraints that limit the flexibility with which timing can be prescribed. Therefore, test engineers must conventionally have a high degree of expertise to configure the clocks of a test system successfully.

Difficulties in prescribing a test system's clocks are compounded when a test setup requires coherence. Coherence imposes the additional constraint that two or more clocks in a tester must have a fixed frequency ratio. Oftentimes, constraints in the clocking system or instruments make it impossible to achieve this ratio at the specific frequencies that the test engineer wishes to use. To work around these constraints, the test engineer generally searches for nearby frequencies that the test system can produce, which also meet the required ratio. This task often comes down to a time-consuming process of trial and error. In addition, nothing about this manual technique ensures that the frequencies ultimately used are the closest realizable frequencies, which meet the ratio constraint, to the originally desired frequencies. Therefore, the current technique does not necessarily minimize frequency errors.

What is needed is a simpler, more accurate technique for programming clocks in an automatic test system.

BRIEF SUMMARY OF THE INVENTION

With the foregoing background in mind, it is an object of the invention to prescribe a configuration of multiple clocks in an automatic test system conveniently.

To achieve the foregoing object, as well as other objectives and advantages, a technique according to the invention is operable on a clocking system that includes a plurality of tiers of clock dividers that successively divide a reference frequency, derived from a master clock frequency, for producing a plurality of desired frequencies. The technique includes determining a least common multiple (LCM) of the desired frequencies and the master clock frequency. Divider values for a first of the plurality of tiers are chosen subject to a requirement that their input frequencies fall within a predetermined range and that they add a minimum number of few new factors to the LCM (preferably none). The LCM is then multiplied by any new factors needed to realize the dividers to yield a new LCM. The process is repeated for all except the last of the other tiers of dividers, updating the LCM each time to include any new factors needed to realize the dividers for the respective tier. Values for the last tier of dividers are chosen in consideration of the updated LCM and the reference frequency.

BRIEF DESCRIPTION OF THE SEVERAL VIEWS OF THE DRAWINGS

Additional objects, advantages, and novel features of the invention will become apparent from a consideration of the ensuing description and drawings, in which—

DETAILED DESCRIPTION OF THE INVENTION

Figure 1:
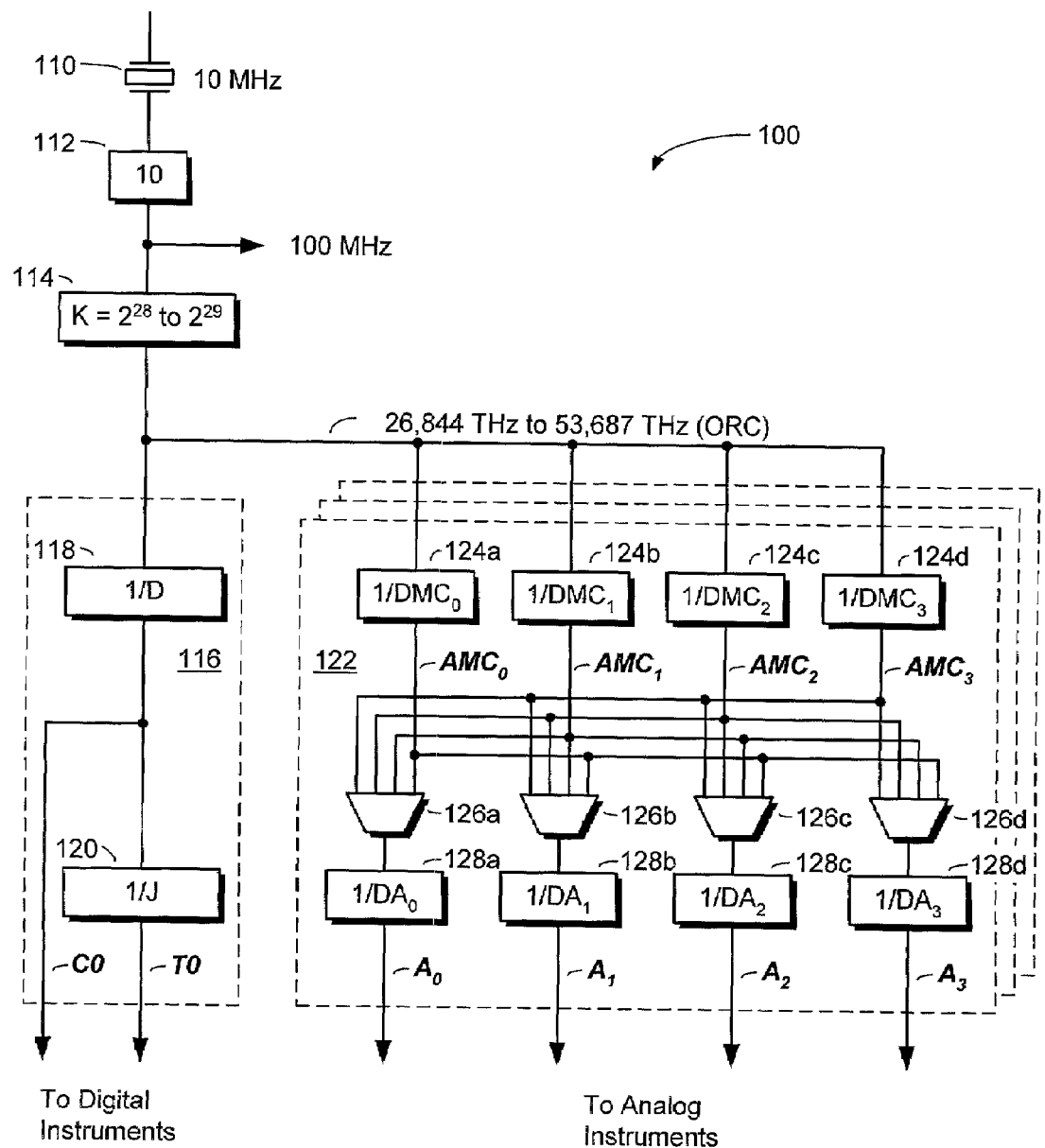
FIG. 1 is a simplified block diagram of the clocking system with which the system for configuring clocks may be used.

FIG. 1 is a simplified, equivalent block diagram of a clocking system 100 with which the system for configuring clocks may be used. The clocking system 100 corresponds to that of the Catalyst™ test system, which is manufactured by Teradyne, Inc., of Boston, Mass. Within the clocking system, a 10 MHz crystal oscillator 110 is frequency-multiplied, by a phase-locked loop 112, to produce a 100 MHz reference clock. The reference clock is frequency-multiplied by a K Multiplier 114 to produce an ultra-high resolution, optical reference clock (ORC). The ORC has both a fixed mode and a variable mode. In fixed ORC mode, K=500,000,000, which corresponds to an ORC frequency of 50,000 THz (1 Terahertz=$10^{12}$ Hz). In variable ORC mode, K is allowed to vary between $2^{28}$ and $2^{29}$, which corresponds to an ORC that ranges between approximately 26,844 THz and 53,687 THz. Because it uses round numbers, fixed ORC mode is generally easier to program than variable ORC mode. Because it is more flexible, however, variable ORC mode more often produces coherent solutions precisely at desired frequencies.

The ORC effectively branches to a digital clocking system 116 and to one or more analog clocking systems 122. The digital clocking system 116 consists of a timing path that includes a first frequency divider 118 for dividing the ORC by an integer "D" to produce a first digital output clock C0. A second divider 120 divides the first digital output clock C0 by an integer "J" to produce a second digital output clock T0. Digital clocks C0 and T0 can then be used to control the timing of digital vectors applied to or sampled from the DUT. The analog clocking system 122 includes four timing paths. Each timing path includes a first frequency divider 124 ($DMC_0$–$DMC_3$) for generating a respective analog master clock ($AMC_0$–$AMC_3$), a multiplexor (any of 126a–d) for directing the output of the first frequency divider, and a second frequency divider 128 ($DA_0$–$DA_3$), for generating a respective output clock ($A_0$–$A_3$). The output clocks $A_0$–$A_3$ are transmitted over an instrument bus, where they are accessible for use by individual instruments.

The Catalyst clocking system employs an internal architecture (not shown) that enables it to operate as if the ORC was running at K*100 MHz. In its physical implementation, however, the reference clock remains fixed at 100 MHz. This detail is operationally transparent, however. Programming the digital clocks C0, T0 and the analog clocks $A_0$–$A_3$ involves merely prescribing divider values for the first and second divider values for each respective timing path, as if the ORC were simply being divided by the divider values.

Figure 2:
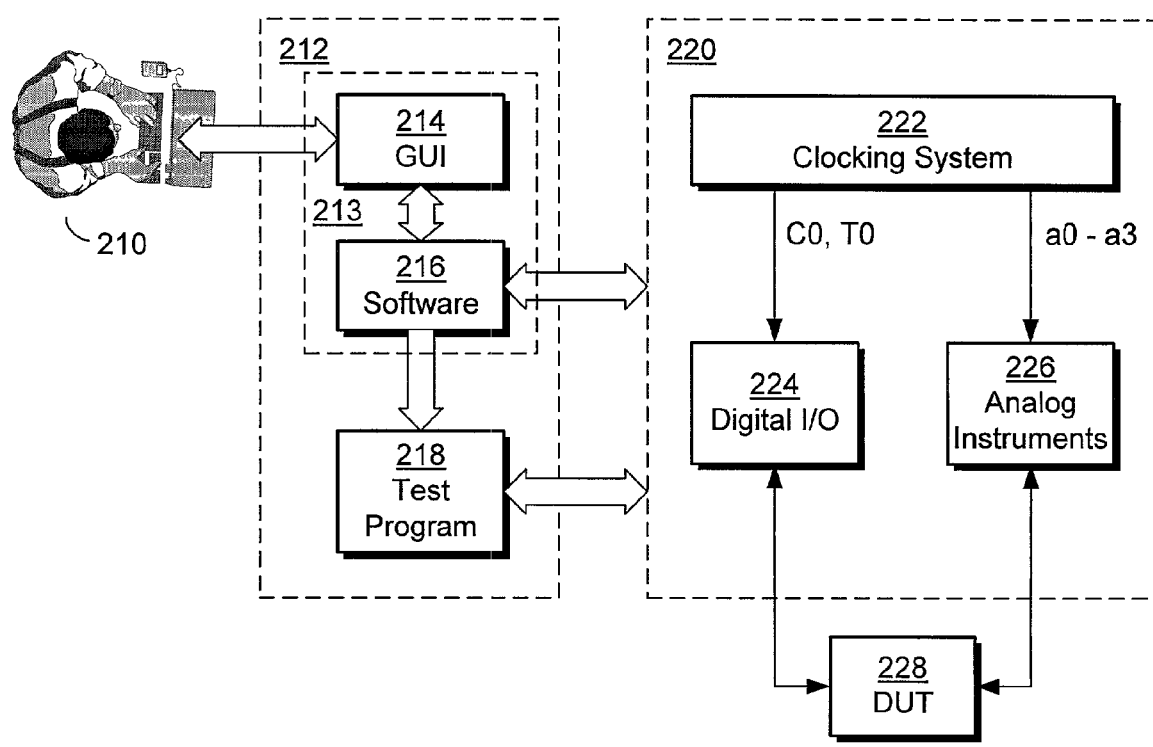
FIG. 2 is a simplified block diagram showing a tester environment in which a user can employ the system for configuring clocks.

FIG. 2 illustrates a tester environment in which the invention may be used. A user 210, for example a test engineer, operates a workstation or other computer 212. The workstation 212 runs a computer program 213 for configuring clocks in a tester 220. The tester 220 includes a clocking system 222, which corresponds to the clocking system 100 of FIG. 1. The tester 220 also includes digital I/O 224, for sourcing and sampling digital signals from a DUT 228 under control of clocks C0 or T0, and analog instruments 224, for sourcing and sampling analog signals under control of the analog clocks $A_0$–$A_3$.

The computer program 213, herein referred to as the "Clock Manager," includes a graphical user interface (GUI) 214 that communicates with software 216. In the preferred embodiment, the Clock Manager is implemented on a PC-compatible computer or workstation using Microsoft® Visual Basic®. The GUI 214 includes fields and controls for receiving user input, displaying output, and receiving commands. The software 216 operates in response to input and commands to generate clocking configuration data. The clocking configuration data specifies how the clocking system (i.e., the dividers and K Multiplier) should be configured to meet the desired clock frequencies specified by the user.

Figure 3:
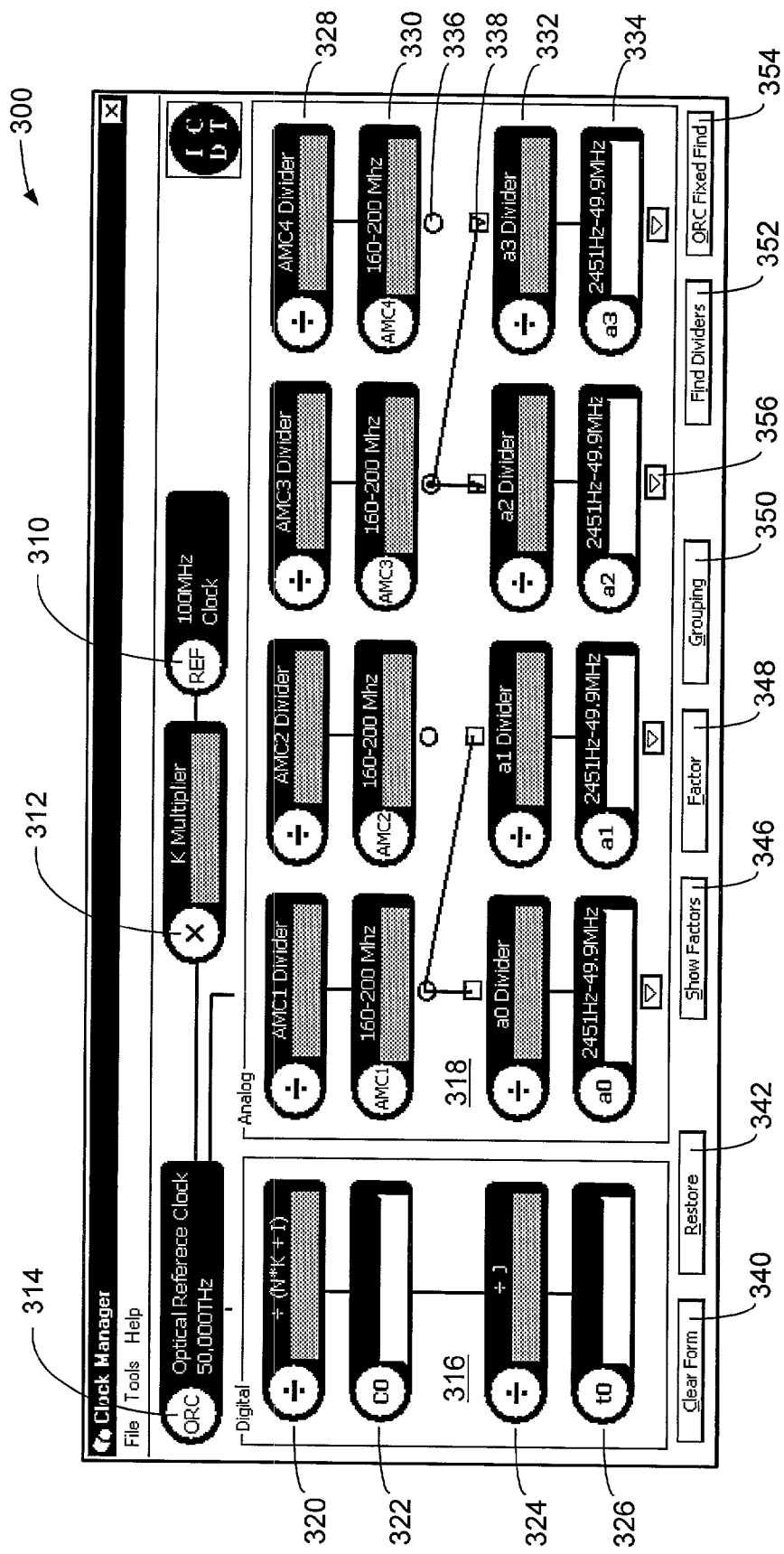
FIG. 3 is an illustration of the Clock Manager Form, which forms part of a graphical user interface of the system for configuring clocks.

The GUI 214 preferably includes forms with which the user can interact. FIG. 3 shows the Clock Manager Form 300, which is preferably displayed when the user first launches the Clock Manager program. The Clock Manager Form 300 presents the user with a graphical model of the test system's clocking system. Within this model, a representation 310 of the 100 MHz reference appears to be frequency-multiplied by a modeled "K Multiplier" 312 to produce an ORC 314. The ORC 314 appears to branch into a digital section 316 and an analog section 318.

Within the digital section, fields 320 and 324 respectively correspond to the first and second frequency dividers 118 and 120 of the clocking system 100, and fields 322 and 326 respectively correspond to the frequencies of the digital clocks C0 and T0. Within the analog section, the ORC branches to four timing paths. Each timing path has fields for the first and second dividers, 328 and 332, which correspond respectively to dividers 124a–d and 128a–d of the clocking system 100. Each timing path also has fields 330 and 334 that correspond to the Analog Master Clock ($AMC_0$–$AMC_3$) and the Analog Clock ($A_0$–$A_3$), respectively.

The analog section 318 also includes radio buttons 336 and checkboxes 338 for designating how the AMC's are to be distributed to second dividers 332 for generating the analog clocks a0–a3. These radio buttons and checkboxes represent the switching functions of multiplexors 126a–d of FIG. 1. By selecting a radio button 336 and checking any number of checkboxes 338, the user effectively "connects" the selected AMC to the input of the second divider 332 of each timing path whose checkbox is selected. Once established, connections remain in place, even when different radio buttons and checkboxes are selected. Newer connections overwrite older connections.

Inputs to the Clock Manager Form of FIG. 3 are designated as unshaded fields, and outputs are designated as shaded fields. To operate the Clock Manager Form 300, the user inputs desired clock frequencies to any of the fields for C0, T0, and $A_0$–$A_3$ (fields 322, 326, and 334, respectively). The user then clicks either the "Find Dividers" button 352 or the "ORC Fixed Find" button 354. In response to either of these button clicks, the software 216 automatically calculates divider values for all dividers required to produce the clocks for which the user has entered desired frequencies. If the user clicks the "Find Dividers" button, the software 216 computes the divider values and K Multiplier for variable ORC mode. If the user clicks the "ORC Fixed Find" button, the software 216 computes the divider values for fixed ORC mode (i.e., K=500,000,000).

Figure 4:
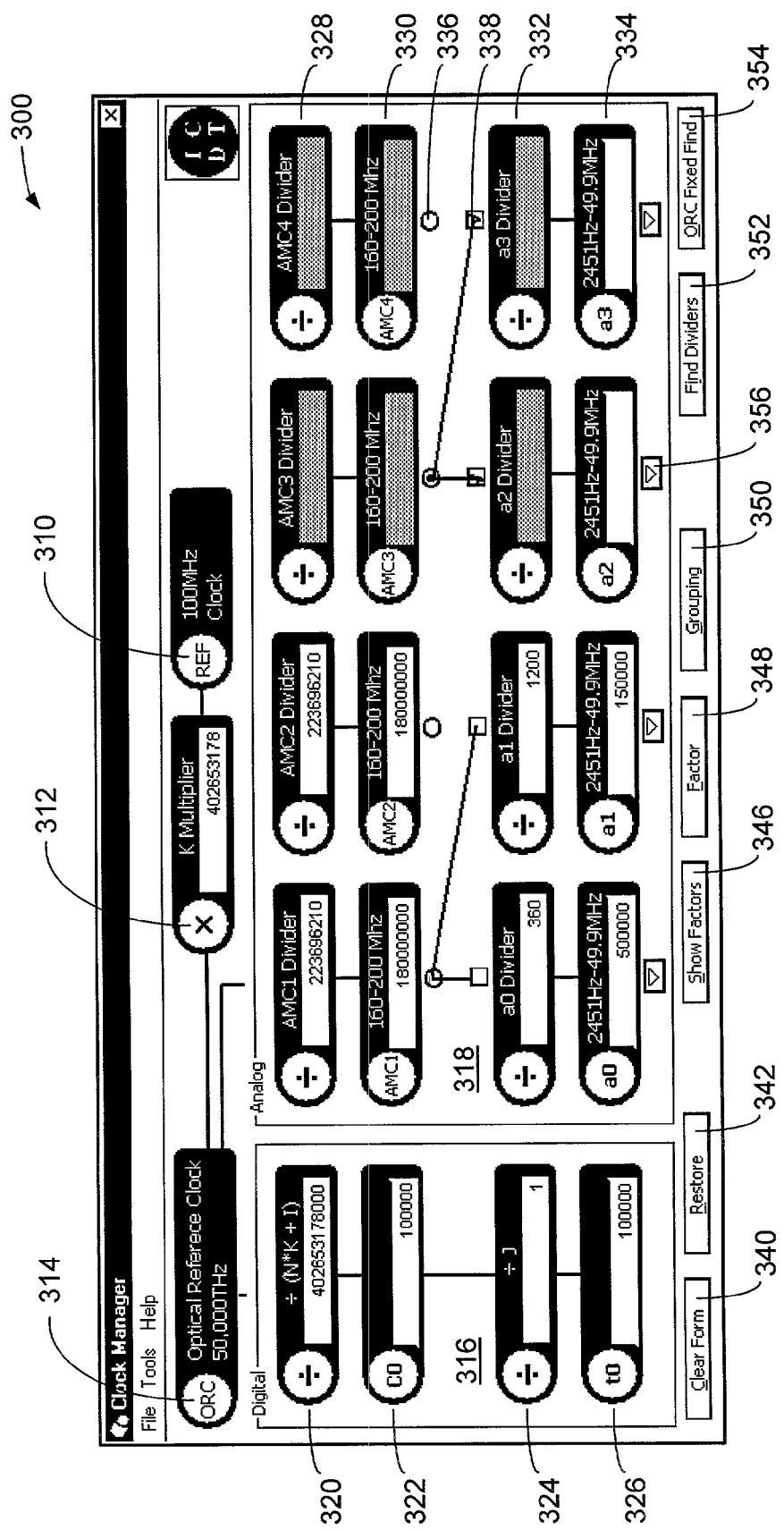
FIG. 4 is an illustration of the Clock Manager Form of FIG. 3, after the system is operated in variable ORC mode.

FIG. 4 shows the output of the Clock Manager Form 300 for variable ORC mode. The user has previously entered 100 MHz in the T0 field (326), 500 KHz in the $A_0$ field, and 150 KHz in the $A_1$ field (334). The user has then clicked the "Find Dividers" button 352. In response, the software 216 has computed and outputted values for the K Multiplier 312, the first and second dividers (for the digital clocks, $A_0$, and $A_1$), and C0 322 (C0 can be either an output or an input. If no input is prescribed, the software assumes J equals 1 and sets C0 equal to T0).

It is important to note that the software 216 has successfully determined values for the K Multiplier and dividers to provide the precise desired frequencies that the user has requested. Because the software was able to precisely hit the desired frequencies, the ratios between T0 and $A_0$, T0 and $A_1$, and $A_0$ and $A_1$ are precisely what the user prescribed. If these ratios are required for coherence, the ratios are preserved and coherence is assured.

Figure 5:
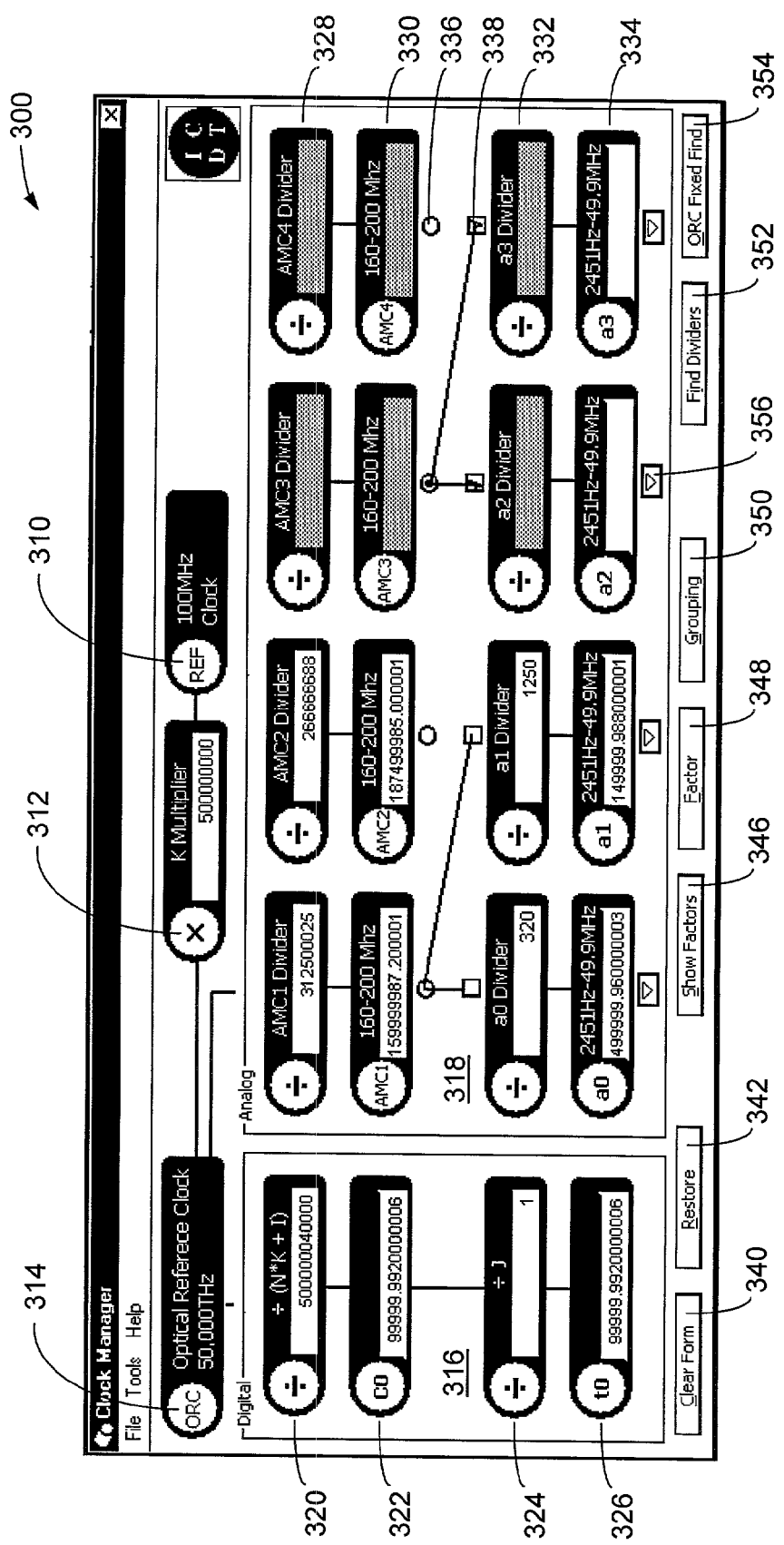
FIG. 5 is an illustration of the Clock Manager Form of FIG. 3, after the system is operated in fixed ORC mode.

FIG. 5 shows the output of the Clock Manager Form 300 for fixed ORC mode. The user has previously entered the same frequencies as in FIG. 4, but has clicked the "ORC Fixed Find" button 354. As before, the software 216 has computed and outputted values for the first and second dividers for T0, $A_0$, and $A_1$. The software has operated under the constraint that the K Multiplier be fixed at 500,000,000, however. This constraint limits the flexibility of the timing system and, in this case, has prevented the software from precisely hitting the target frequencies. Rather than abandoning its search or simply generating an error, the software 216 finds the frequencies closest to the desired target frequencies that meet the prescribed ratio. Since the ratio of the displayed frequencies for T0, $A_0$, and $A_1$ are the same as the ratios of the originally prescribed target frequencies, coherence is still assured.

Note that the frequency error generated by fixed ORC mode is exceedingly small, less than 0.1 parts per million, in this case. This error is much smaller than other errors typically found in test systems, and can generally be ignored. The Clock Manager Program therefore enables the test engineer to derive coherent clocks for fixed ORC mode, without significantly sacrificing frequency accuracy. This is a great benefit to the test engineer, because fixed ORC mode is generally easier to use than variable ORC mode.

The operation of variable ORC mode and fixed ORC mode has been illustrated with only two target frequencies. More target frequencies can be prescribed, however, as testing needs require.

Certain tests do not require coherent clocks, or do not require that all the clocks prescribed for a test be coherent. Other tests require different sets of coherent clocks. Because coherence is a constraint that limits the software's ability to hit the target frequencies (especially in fixed ORC mode), the GUI 214 preferably allows the user to remove the constraint if it is not required. By pressing the "Grouping" button 350, the GUI displays a Coherency Grouping Form 600 that allows the user to group different clocks together, or to separate clocks into different groups.

Figure 6:
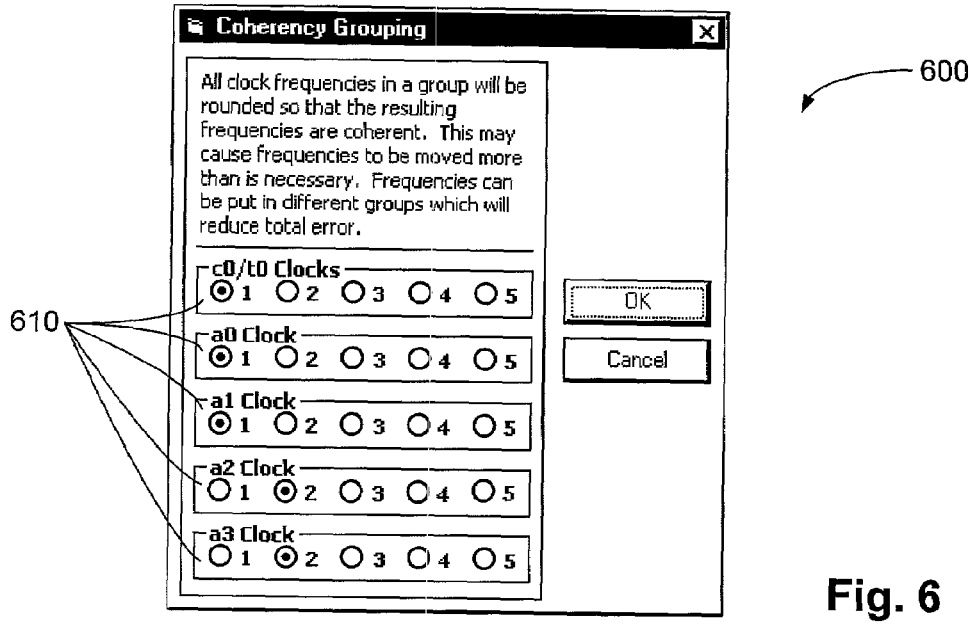
FIG. 6 is an illustration of the Coherency Grouping Form, which can be accessed via a control on the Clock Manager Form.

FIG. 6 shows the Coherency Grouping Form 600. A set 610 of radio buttons, numbered 1–5, is provided for C0/T0 and each of analog clocks shown on the Clock Manager Form (T0 and C0 are treated as one clock because they are inherently grouped together). The user assigns a clock to a group by clicking the radio button for a group number. Only one group number can be selected for each clock. The user assigns different clocks to the same group by giving them the same group number, or assigns different clocks to different groups by giving them different group numbers. Upon clicking the "Find Dividers" or "Fixed ORC Find" button, the software computes divider values (and K Multiplier, for variable ORC mode) that preserve the ratios of the desired frequencies within each group. The software does not necessarily preserve ratios among clocks assigned to different groups.

Coherency requires not only that inputted ratios among the clocks be preserved, but also that the ratios be correct. To this end, the Clock Manager Program includes an Instrument Form 700 for assisting the user in correctly prescribing coherent captures. The user invokes the Instrument Form 700 for a particular clock by clicking the Clock Assign Button 356 for that clock on the Clock Manager Form 300. A different Clock Assign Button is provided for each analog clock $A_0$–$A_3$.

Figure 7:
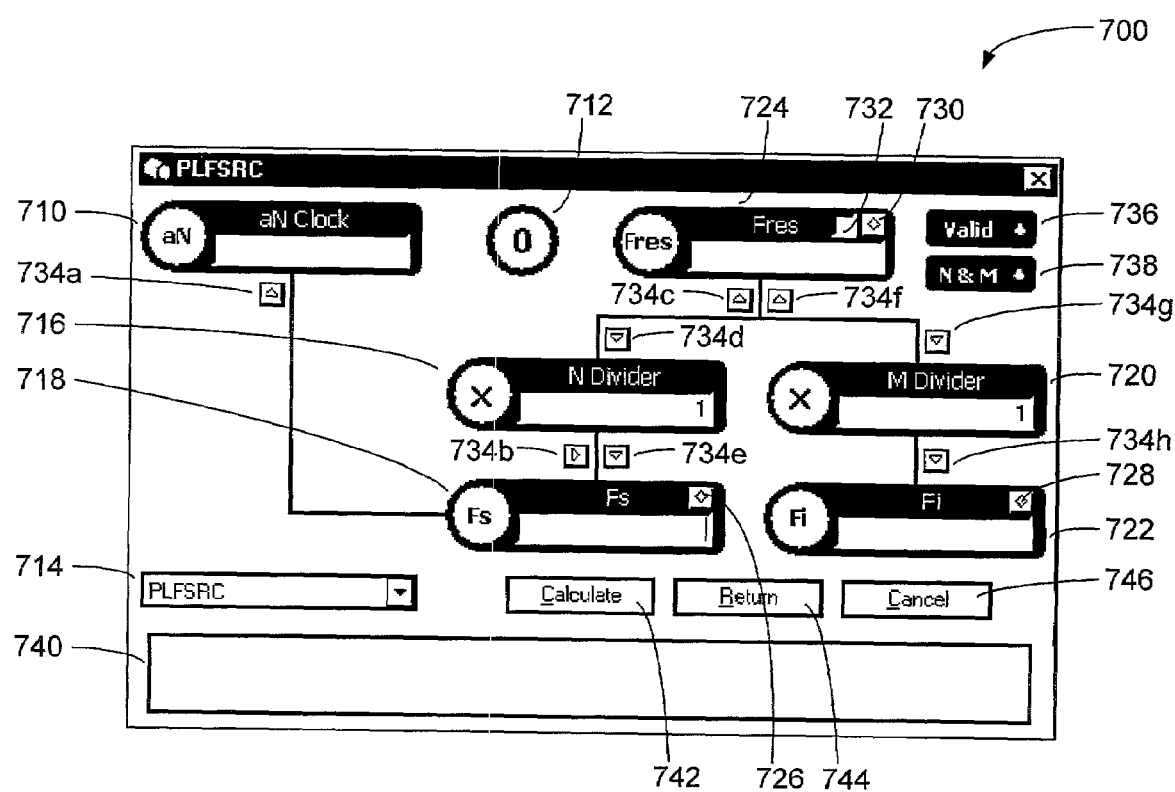
FIG. 7 is an illustration of the Instrument Form, which can be accessed via one or more controls on the Clock Manager Form.

FIG. 7 shows the Instrument Form 700. The Instrument Form 700 includes an aN Clock field 710, which specifies the frequency of the analog input clock ($A_0$–$A_3$). Label 712 indicates the number of the selected clock (here, "0" for clock a0). The user operates the Instrument Form 700 by first selecting an instrument from an Instrument Field 714, which is preferably implemented as a combo box. When the user clicks the Instrument Field, the field displays a list of all instruments that the form is capable of configuring. The user selects a desired instrument from the list, whereupon the Instrument Field displays the name of the selected instrument. The user can then specify timing characteristics for configuring the selected instrument.

Timing characteristics can be specific to each instrument type, but generally include sampling rate ($F_s$), number of samples (N), frequency of interest ($F_i$), and number of cycles (M) of the frequency of interest. These timing characteristics apply to both source and measure instruments. For an AWG, for example, $F_s$ specifies the rate at which the AWG generates output samples, N specifies the number of samples generated, $F_i$ specifies the output frequency, and M specifies the number of cycles generated at $F_i$. For a digitizer, $F_s$ is the digitizer's sampling rate, N is the number of samples acquired during the sample window, $F_i$ is the expected frequency to be measured, and M is the number of cycles at $F_i$ that are completed during the sample window.

The Instrument Form 700 includes fields for each of $F_s$, N, $F_i$, and M (716, 718, 720, and 722, respectively). It also includes a field 724 for frequency resolution, $F_{res}$. Frequency resolution depends upon $F_s$ and N, or, alternatively, on $F_i$ and M, based on the equation $F_{res}=F_s/N=F_i/M$. For a digitizer, $F_{res}$ represents the bin width of a DFT taken from its acquired samples. For an AWG, $F_{res}$ represents the smallest frequency increment in which the AWG can be programmed. The Instrument Form 700 allows the user to configure $F_{res}$ separately because users often prefer to specify timing in terms of $F_{res}$.

Figure 8:
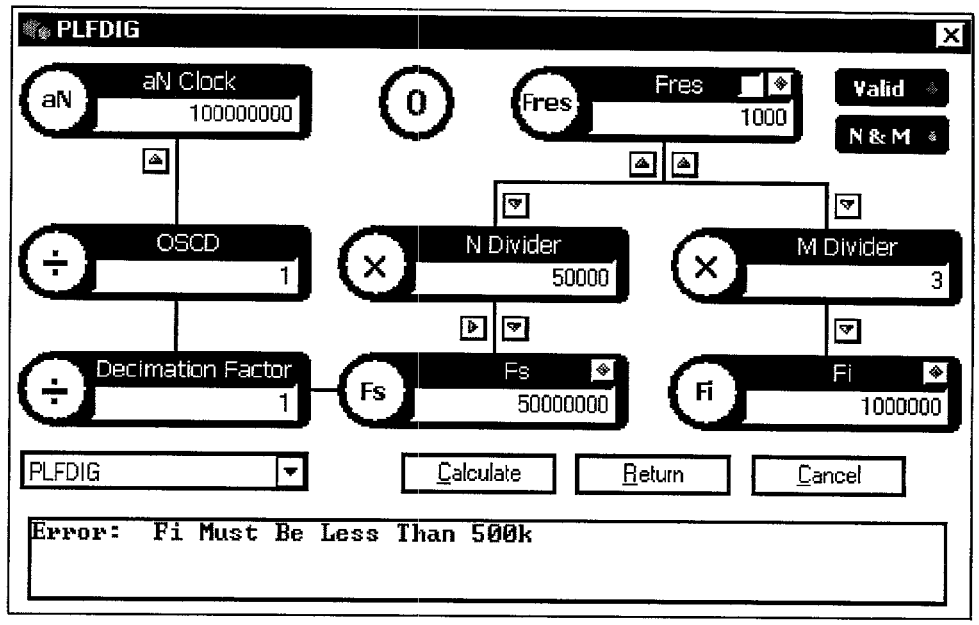
FIG. 8 is an illustration of the Instrument Form of FIG. 7, showing the selection of a different instrument from the one selected in FIG. 7.

The Instrument Form 700 presents the user with different fields when different instruments are selected, depending on the particular requirements of each instrument. For example, when the user selects the Precision Low-Frequency Source (PLFSRC), the Instrument Form presents only the fields described above (See FIG. 7). But when the user selects the Precision Low-Frequency Digitizer (PLFDIG), the Instrument Form displays two additional fields, one for multiplying aN Clock and one for dividing aN Clock to derive $F_s$ (See FIG. 8).

Returning to FIG. 7, the Instrument Form 700 includes arrow buttons 734a–h to assist the user in computing values for various fields. When the user clicks any of these arrow buttons 734a–h, the software computes a value for the field the arrow button points to, based upon one or more of the other fields on the form. Clicking button 734c computes $F_{res}$ based upon previously entered values of $F_s$ and N ($F_{res}=F_s/N$). Conversely, clicking button 734e computes $F_s$ based on previously entered values of $F_{res}$ and N. Clicking button 734d finds the best value of N, given the previously entered values of $F_s$ and $F_{res}$. If $F_s/F_{res}$ is an integer, the software simply assigns $N=F_s/F_{res}$. If $F_s/F_{res}$ is not an integer, the software works in one of two ways, depending on the state of checkbox 732. If the checkbox 732 is checked, the software holds $F_{res}$ constant in computing the best value of N. If the checkbox 732 is unchecked, the software holds $F_s$ constant in computing N. In either case, the software selects the value of N that effects the smallest change in the timing characteristic that it is not instructed to hold constant—$F_s$ or $F_{res}$. Buttons 734f, g, and h work analogously to buttons 734c, d, and e, respectively, based on the constraint that $F_{res}=F_i/M$.

The Instrument Form 700 also includes a Calculate Button 742. Clicking the Calculate Button directs the software to calculate $F_{res}$, M, and N, based on previously entered values of $F_s$ and $F_i$. Given the equation $F_s/F_i=N/M$, the software first attempts to calculate N and M by reducing the fraction $F_s/F_i$ to simplest terms. The software assigns the numerator of the reduced fraction to N, and the denominator to M. $F_{res}$ is then computed as $F_s*N$. If N is larger than allowed (i.e., the inputted values require that the instrument take too many samples), the software successively shifts $F_i$ by small increments in search of the smallest integer values of N and M that place M and N within the allowable range. The resulting mismatch between the entered $F_i$ and actual $F_i$ is generally exceedingly small.

By clicking the arrow button 734a on the Instrument Form, the GUI transfers the value of $F_s$ to the aN Clock Field 710. The user can close the Instrument Form 700 by clicking the Cancel Button 746 or the Return Button 744. Clicking the Cancel Button 746 aborts the Instrument Form and returns control to the Clock Manager Form 300. Clicking the Return Button 744 stores the state of the Instrument Form 700 and closes the form. It also sends the contents of the aN Clock Field 710 to the Analog Clock Field 344 of the Clock Manager Form 300 for the selected clock, i.e., the clock $A_0$–$A_3$ for which the user originally clicked the Clock Assign Button 356.

As indicated above, instrument configurations are inherently subject to the constraint that $F_s/N=F_i/M$. We can rewrite this equation in the form $F_s/F_i=M/N$, whereupon it becomes clear that the fraction M/N must be reduced to simplest terms to prevent the instrument from generating or acquiring redundant data. To avoid redundant data, the Instrument Form 700 includes an "N & M" status indicator 738. The indicator turns green when M/N is in simplest terms (i.e., M and N are mutually prime); otherwise, the indicator turns red.

The Instrument Form 700 also includes a Valid Indicator 736 and a Diagnostic Field 740. Instrument capabilities constrain the flexibility with which timing characteristics can be configured. For instance, an AWG is designed to operate over only a limited range of sampling rates and to receive input signals over only a limited bandwidth. The software includes an Instrument Database to ensure that the inputted timing characteristics for each instrument accord with the instrument's capabilities. The Instrument Database stores programming constraints for each instrument that is configurable using the Instrument Form 700. In response to the user entering data in any of the timing fields (e.g., fields 716–724), the software runs a validation routine. The validation routine compares the inputted timing characteristics with the stored programming constraints in the Instrument Database. If the inputted timing characteristics violate any of the instrument's programming constraints, the Valid Indicator 736 turns red and a diagnostic message is displayed in the Diagnostic Field 740. The diagnostic message generally identifies the violating timing characteristic and specifies an allowable range over which the timing characteristic can be programmed (See FIG. 8). Sometimes, an instrument configuration is invalid because certain combinations of timing characteristics are incompatible. In these cases, the diagnostic message preferably includes suggestions for modifying the timing characteristics. If the inputted timing characteristics do not violate any of the programming constraints stored in the Instrument Database, the Valid Indicator 736 turns green and the Diagnostic Field 740 is cleared.

As discussed above, coherence generally requires coordination among different clocks in a tester. Consider the case where a tester measures the gain of an amplifier at a particular frequency. An AWG applies a stimulus having frequency $F_i$ to the input of the amplifier, and a digitizer captures an amplified response from the amplifier's output. Since the amplifier's output frequency is also $F_i$, the digitizer must sample the DUT's response over a sample window that includes an integer number of cycles of $F_i$. In this case, therefore, $F_i$ of the digitizer must equal $F_i$ of the AWG to ensure coherence.

The Instrument Form 700 simplifies the task of ensuring coherence by allowing the user to configure one instrument's timing characteristics as a function of another instrument's timing characteristics. Clicking buttons 326, 328, and 330 on the Instrument Form causes the form to display additional fields for configuring timing dependencies for $F_s$, $F_i$, and $F_{res}$, respectively.

Figure 9:
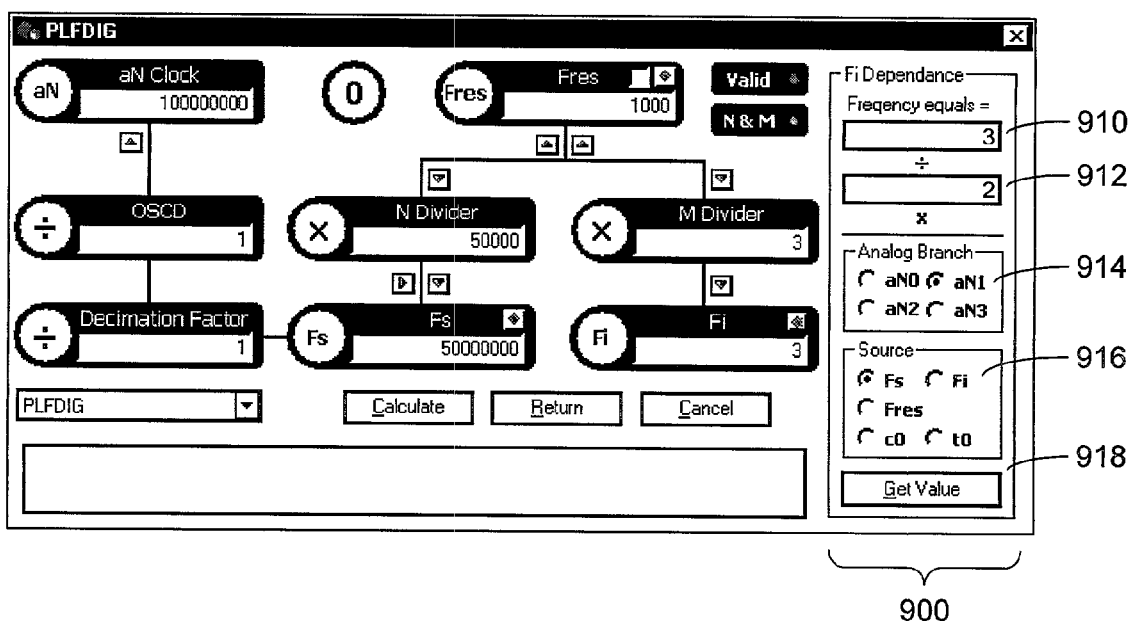
FIG. 9 is an illustration of the Instrument Form of FIG. 7, showing a calculator portion for computing frequency dependencies.

FIG. 9 shows the Instrument Form 700 after the user has clicked the button 728, for $F_i$ dependence. As shown in FIG. 9, the Instrument Form displays a calculator region 900, which was previously hidden. The calculator region 900 includes a numerator field 910 and a denominator field 912. It also includes an analog branch region 914, a source region 916, and a Get Value button 918. The user specifies a clock dependency for $F_i$ by entering a numerator and a denominator in fields 910 and 912, selecting a clock from the analog branch region 914, and choosing one of the timing characteristics for the selected clock from the source region 916. Regions 914 and 916 include radio buttons that allow only one item to be selected from each region. The settings displayed in the example of FIG. 9 correspond to an $F_i$ frequency that equals 3/2 the $F_s$ frequency specified for analog clock a1. As shown in the calculator region 900, $F_i$ can be configured based on any of the other clocks in the system, for of the timing characteristics shown. The user can click the Get Value button 918 once the user has set the fields 910, 912, 914, and 916. Clicking this button computes a value for $F_i$ based on the entered settings and returns the computed value to the $F_i$ field 722.

The contents of the calculator region 900 are substantially identical regardless of which of the buttons 326, 328, or 330 has been clicked, with the exception that the title of the calculator region is changed based on the button pressed. The title reads, "$F_s$ Dependence" when button 726 is clicked, "$F_i$ Dependence" when button 728 is clicked, and "$F_{res}$ Dependence" when the button 730 is clicked.

Figure 10:
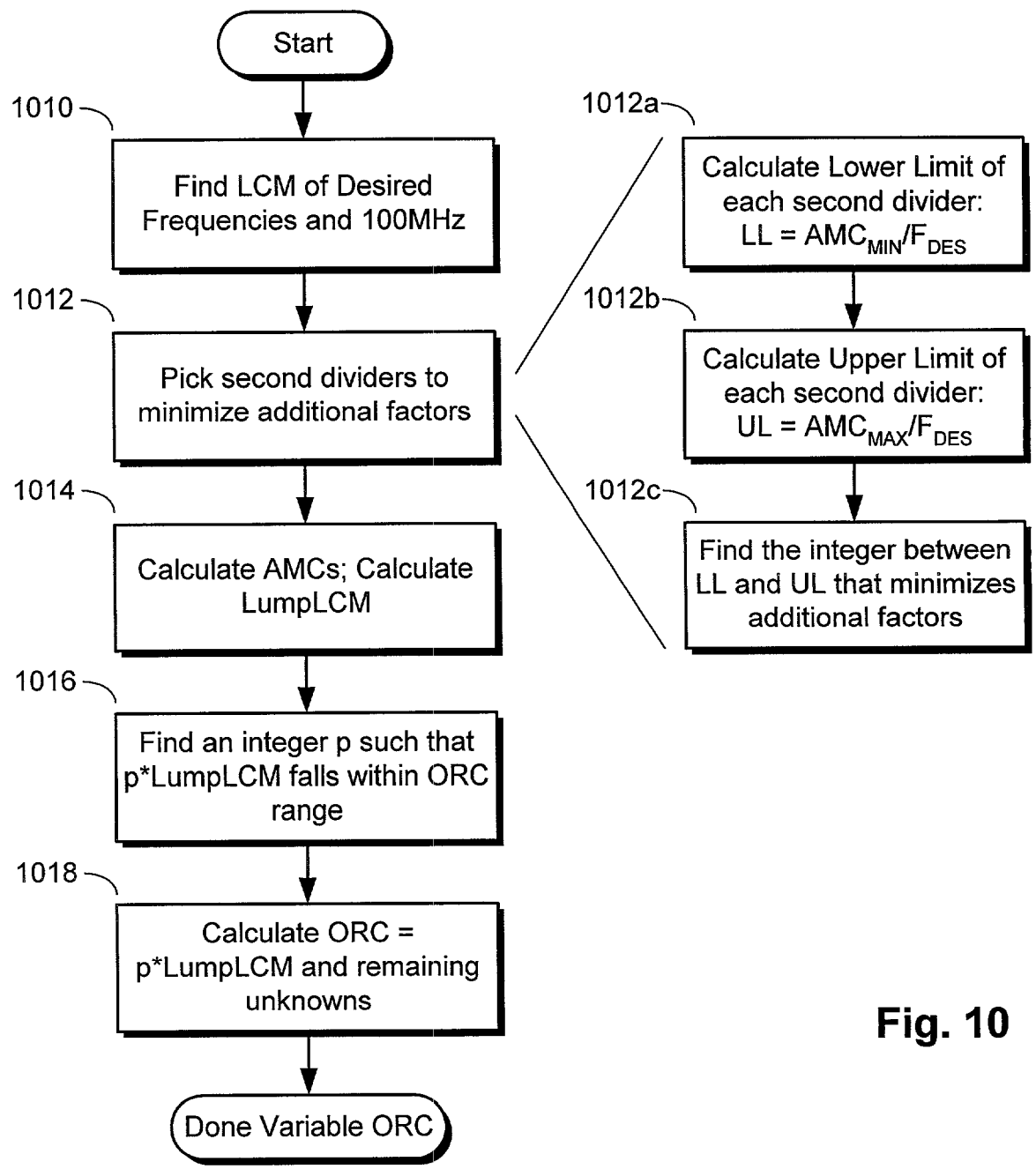
FIG. 10 is a flowchart showing an algorithm for determining divider values for a clocking system using variable ORC mode.
Figure 11:
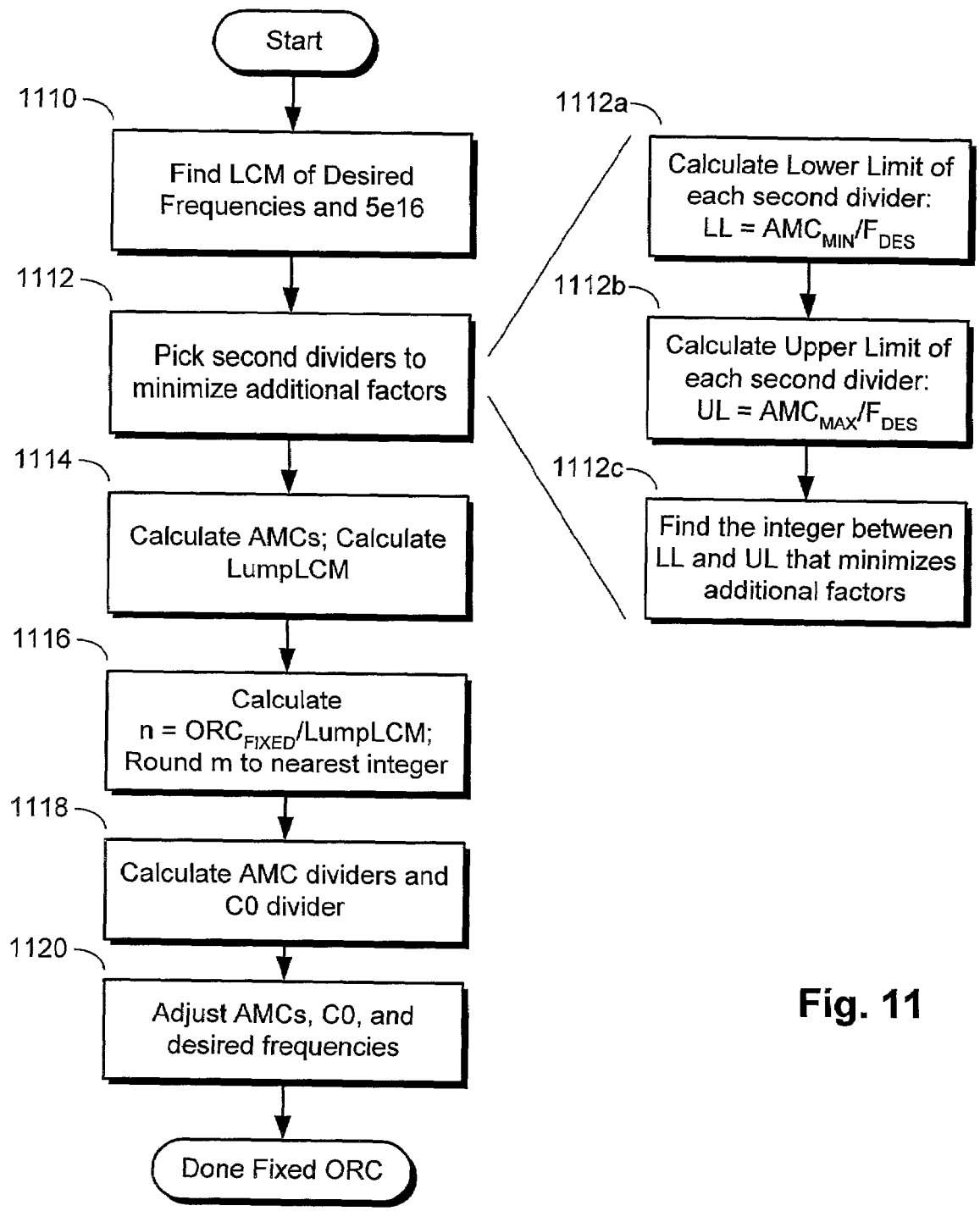
FIG. 11 is a flowchart showing an algorithm for determining divider values for a clocking system using fixed ORC mode.

FIGS. 10 and 11 show examples of algorithms according to the invention for configuring a tester's clocking system for variable ORC mode (FIG. 10) and fixed ORC mode (FIG. 11). Preferably, the algorithms are executed by the software 216, which operates in response to user input and commands from the GUI 214. The software 216 preferably executes one of these algorithms whenever the user has entered desired frequencies in the Clock Manager Form 300 and has clicked either the Find Dividers button 352 or the ORC Fixed Find button 354. Referring briefly to FIG. 1, we first recognize that the elements of the clocking system 100 are mathematically related as follows:

$$C0*D=ORC; \tag{1}$$

$$A_L*DA_L*DMC_L=ORC; L=0, 1, 2, \text{ and } 3; \text{ and} \tag{2}$$

$$100 \text{ MHz}*K=ORC. \tag{3}$$

To realize the desired frequencies using frequency dividers (e.g., counters), we search for a solution set for which K and each of the following dividers is an integer: D, $DA_L$, and $DMC_L$; L=0, 1, 2, and 3.

Referring first to FIG. 10, the algorithm for variable ORC mode first seeks to determine the least common multiple (LCM) of the desired frequencies and the frequency of the master clock, i.e., the LCM of $A_0$–$A_3$, C0, and 100 MHz (step 1010). If the user has entered fewer desired frequencies in the fields of the Clock Manager Form, step 1010 ignores the blank fields and finds the LCM of only the fields for which the user has entered desired frequencies. The resulting LCM is the smallest number into which each of the desired frequencies and the master clock can be evenly divided. Being divisible in this way means that counters or other integer-based dividers can be used to generate each desired frequency from the ORC. It also means that K can be realized as an integer to generate the ORC from the master clock.

It is significant that the LCM is the "least" common multiple, rather than some other common multiple, of the desired frequencies and the master clock. Making the LCM the "least" common multiple maximizes the flexibility with which the algorithm can distribute divisions among different tiers of dividers in the clocking system (i.e., first dividers 124 and second dividers 128). This is important because the Analog Master Clocks ($AMC_0$–$AMC_3$) in the Catalyst test system have an upper and a lower frequency limit. Therefore, the second dividers 128 ($DA_L$) must be chosen so that the desired frequencies $F_{DES-L}$ times the second dividers $DA_L$ fall within the allowable range of the AMCs. In addition, if the LCM is greater than the maximum allowable ORC ($2^{29}$), no solution will enable the clocking system to precisely produce the desired frequencies. Finding the "least" common multiple thus affords the algorithm its highest probability for success.

At step 1012, the algorithm determines the values of the $DA_L$ dividers 128. This step operates under two constraints. First, the product of each $DA_L*F_{DES-L}$ must fall within the allowable range of the respective AMC. Second, the value of $DA_L$ should preferably add as few factors as possible (ideally none) to the LCM. This means that, to as great an extent as possible, the factors of the $DA_L$ dividers should be a subset of the factors of the LCM. As before, minimizing factors promotes greater flexibility in configuring the clocking system and improves the chances of attaining a successful setup.

Steps 1012a–1012c expand the detail of step 1012. For each analog timing path, the algorithm computes a lower limit (LL) and an upper limit (UL) of $DA_L$ that places $AMC_L$ within its allowable range. Thus, $$LL=AMC_{MIN}/F_{DES-L}, \text{ and} \tag{4}$$

$$UL=AMC_{MAX}/F_{DES-L}. \tag{5}$$

To ensure that LL and UL are within range, LL is rounded up and UL is rounded down. The algorithm then examines each integer from LL to UL and determines its factors. If an integer is found that adds no new factors to the LCM, the algorithm assigns $DA_L$ the value of that integer and stops searching. Otherwise, the algorithm assigns $DA_L$ the value of the integer that adds the fewest additional factors to the LCM. This process is repeated for each analog timing path.

At step 1014, the algorithm calculates each $AMC_L$ as $F_{DES-L}*DA_L$. The algorithm also computes an updated LCM, called "LumpLCM," which includes all the factors of the original LCM, plus any additional factors that were needed to realize the $DA_L$ dividers.

At step 1016, the algorithm finds for another integer, "p," such that the product p*LumpLCM falls within the allowable range of the ORC, here $2^{28}$–$2^{29}$. Given this constraint, p can be any integer between $ORC_{MIN}$/LumpLCM and $ORC_{MAX}$/LumpLCM. The middle value of p within this range is used for subsequent processing; however, the choice of p is arbitrarily and any of the values that fall within the designated range can be used.

Once p is known, the remaining clock settings fall into place (step 1018). In particular, $$ORC=p*\text{Lump}LCM; \tag{6}$$

$$K=ORC/100 \text{ MHz}; \tag{7}$$

$$D=ORC/C0; \text{ and} \tag{8}$$

$$DMC_L=ORC/AMC_L. \tag{9}$$

At the conclusion of step 1018, the algorithm has finished computing clocking configuration data for variable ORC mode. The algorithm has either precisely hit the desired frequencies, or the setup has failed because the LumpLCM is larger than the greatest allowable ORC.

In variable ORC mode, coherency grouping need not be considered because the flexibility of varying the ORC obviates the need for rounding. Since frequencies are not rounded, frequency ratios are preserved across all clocks, whether coherence is required or not.

Referring now to FIG. 11, the first three steps 1110–1114 for fixed ORC mode are closely related to steps 1010–1014 of FIG. 10. At step 1110, the algorithm seeks as before to find the least common multiple (LCM) of the desired frequencies and the frequency of the master clock, i.e., the LCM of A0–A3, C0, and 100 MHz. At step 1110, however, the algorithm also seeks to find a larger least common multiple, "BigLCM," of the desired frequencies and the ORC, i.e., the LCM of A0–A3, C0, and 50,000 THz. BigLCM is then used at step 1112, wherein the second dividers are chosen to minimize new factors beyond those already included in BigLCM. The factors of BigLCM are relevant, instead of those of LCM, to allow the algorithm to find, whenever possible, divider values that exactly produce the desired frequencies (i.e., without rounding—see below). Note that BigLCM is used only for minimizing new factors in step 1012. Once the new factors, if any, are determined, the algorithm calculates LumpLCM as the product of LCM any additional factors needed to realize the second dividers.

At step 1114, the algorithm computes the AMCs as using the second dividers determined at step 1112. The actions performed at this step are substantially identical to those performed at step 1012 in FIG. 10.

Proceeding now to step 1116, the algorithm computes a value n=$ORC_{FIXED}$/LumpLCM, where $ORC_{FIXED}$ is nominally 50,000 THz. Because n is not necessarily an integer, the algorithm preferably rounds n to the nearest integer $n_r$ to ensure that the clocking system can be configured with counters or other integer-based dividers. At step 1118, the algorithm computes the DMC dividers 124$a$–$d$ and the D divider 118 as follows:

$$DMC_L = n_r * \text{LumpLCM}/AMC_L; \; L=0, 1, 2, \text{ and } 3; \text{ and} \quad (10)$$

$$D = n_r * \text{LumpLCM}/C0. \quad (11)$$

If n was not originally an integer, then rounding n to produce $n_r$ produces a rounding error, $n_r/n$, which affects the AMCs and the desired frequencies. At step 1120, the algorithm accounts for this rounding error in computing the actual frequencies as follows:

$$AMC_L = ORC_{FIXED}/DMC_L; \; L=0, 1, 2, \text{ and } 3; \quad (12)$$

$$F_{DES-L} = AMC_L/DA_L; \; L=0, 1, 2, \text{ and } 3; \text{ and} \quad (13)$$

$$C0 = ORC_{FIXED}/D. \quad (14)$$

At the conclusion of step 1120, the algorithm has finished computing clocking configuration data for fixed ORC mode.

Note that each of the desired frequencies and C0 is askew from its originally prescribed value by a factor $n_r/n$ (assuming $n_r \neq n$). Because this factor is present in all frequencies that the clocking system produces, ratios among different frequencies are retained. Therefore, coherence is assured, despite the fact that precise target frequencies can not always be attained.

Frequency errors produced by this technique are exceedingly small. The emphasis on minimizing the number of factors in LumpLCM generally ensures that n is a large number. Therefore, the factor $n_r/n$ is generally close to 1, ensuring that actual frequencies are very close to their originally prescribed values. Because LumpLCM is minimized, the algorithm minimizes frequency errors to the theoretically lowest values that the clocking system can achieve, while still ensuring coherence. These frequency errors are often smaller than other timing errors commonly found in test systems—so small, in fact, that they can generally be ignored.

Coherency grouping is significant for fixed ORC mode, because rounding errors distort frequency values. For fixed ORC mode, the algorithm simply treats different coherency groups as if they belonged to different clocking systems. Different groups are thus allowed have different LumpLCMs and different values of n. It may be necessary to round n for some groups but not for others. Therefore, some groups may have frequency errors, while others may not.

The foregoing description assumes that each of the multiplexors 126$a$–126$d$ passes the AMC for its respective timing path to its output, i.e., multiplexor 126$a$ passes $AMC_0$, multiplexor 126$b$ passes $AMC_1$, and so on. As indicated above, however, the system for configuring clocks is not limited to this arrangement. In the preferred embodiment, the algorithm accounts for switching by computing divider values based on actual connections.

The system herein described greatly simplifies the task of configuring multiple clocks in a test system. It automatically generates clocking configuration data based on user-specified frequencies, and guides users to specify valid configurations by checking inputs against clocking system and instrument capabilities. The system is also expandable. The system can accommodate new instruments through updates to the Instrument Form 700 and instrument database. In addition, the algorithm can easily handle additional clocks because the time needed to execute the algorithm scales linearly with the number of clocks.

Alternatives

Having described one embodiment, numerous alternative embodiments or variations can be made. For example, the Clock Manager program has been described herein in connection with the Catalyst test system. The invention is not limited to use with this test system, however. It can be used with any test system having a reference clock, any number of clocks derived therefrom using frequency dividers and/or multipliers. The embodiment described herein includes two tiers of frequency dividers, e.g., a first tier including dividers 128 and a second tier including dividers 124. It is apparent from the foregoing, however, that the algorithm is scalable for use with clocking systems having greater than two tiers of dividers. In particular, the algorithm could be scaled by repeating steps 1012 and 1014 (or steps 1112 and 1114) for each successive tier. Values for each successive tier of dividers would be chosen to meet frequency range requirements, as well as to add as few factors as possible to LCM.

The foregoing description employs mathematical expressions for conveying an understanding of the underlying algorithm. The algorithm should not be limited to these particular expressions, however. As known to those skilled in the art, mathematics provides great flexibility in expressing quantitative concepts in a wide variety of forms. The invention should therefore be construed as encompassing algorithms achieving substantially the same result using a wide variety of substantially equivalent mathematical forms.

As described herein, the system for configuring clocks is implemented as a Visual Basic® program running on a PC-compatible computer. The invention is not limited to this implementation, however. As known to those skilled in the art, many different software and hardware environments can be used to implement the system according to the invention.

The system for configuring clocks need not be provided as a single computer program, per se. It can be packaged in a myriad of ways, such as with different software modules, software libraries, or computer programs that communicate with one another. Moreover, the interface for communicating with the system need not necessarily be a GUI. It can instead be a software interface for communicating with other software components.

The system for configuring clocks need not necessarily be run on a tester. It can also be run on a development station or on any computer on which test programs are developed, debugged, or examined. It can also be used for demonstration or training purposes.

In addition to generating configuration data, the system for configuring clocks can also be used to program a tester's clocking system directly. For example, the GUI of the Clock Manager can include an additional control that, when activated, causes the software to set up the tester according to the clocking configuration data. The clocks could thus be run in a "live" mode to examine or troubleshoot particular test scenarios. As yet another alternative, the GUI can include a control for generating test program code. When activated, the control causes the software to generate test program code for inclusion in a test program. The test program code can be in the native language of the tester, or in a universal testing language that is later translatable into tester-specific code. When the test program is later run, the program code will configure the tester in accordance with the clocking configuration data to establish the desired configuration.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A method operable on a clocking system that includes a plurality of tiers of clock dividers that successively divide a reference frequency derived from a master clock frequency for producing a plurality of clock signals having desired frequencies, comprising:
   (A) determining a least common multiple (LCM) of the desired frequencies and the master clock frequency;
   (B) selecting divider values for one of the plurality of tiers of dividers subject to a requirement that input frequencies to that tier of dividers fall within a predetermined range and that they add a minimum number of few new factors to the LCM;
   (C) multiplying the LCM by any new factors needed to realize the dividers of the selected tier of dividers to yield a LumpLCM;
   (D) repeating steps B and C for all except the last tier of dividers, including updating the LumpLCM for each repetition to include any new factors needed to realize the dividers for the respective tier;
   (E) computing values for the last tier of dividers responsive to LumpLCM and the reference frequency; and
   (F) producing the plurality of clock signals responsive to at least one of the divider values.

2. A method as recited in claim 1, wherein the reference frequency is defined as a product of a master clock frequency and a K multiplier, and wherein the K multiplier is variable for varying the reference frequency.

3. A method as recited in claim 2, further comprising:
   determining an integer p such that p*LumpLCM falls within an allowable range of the reference frequency; and
   computing the reference frequency as the product p*LumpLCM.

4. A method as recited in claim 3, further comprising:
   computing the K multiplier as the reference frequency divided by the master clock frequency.

5. A method as recited in claim 1, wherein the reference frequency is defined as a product of a master clock frequency and a fixed K multiplier.

6. A method as recited in claim 5, further comprising:
   determining a least common multiple (BigLCM) of the desired frequencies and the reference frequency,
   wherein the step (B) of selecting divider values for one of the plurality of tiers of dividers is subject to a requirement that input frequencies add a minimum number of few new factors to BigLCM.

7. A method as recited in claim 6, further comprising:
   determining a real number n such that n*LumpLCM equals the reference frequency; rounding n to the nearest integer to yield $n_r$; and
   modifying the desired frequencies by a factor $n_r/n$ to account for rounding errors introduced in the rounding step.

8. A method as recited in claim 1, wherein the clocking system consists of two tiers of dividers.

9. A method operable on a clocking system that includes a plurality of tiers of clock dividers that successively divide a reference frequency, which is variable over an allowable range, for producing a plurality of clock signals having desired frequencies, the reference frequency being defined as a product of a master clock frequency and a variable multiplier K, the method comprising:
   (A) determining a least common multiple (LCM) of the desired frequencies and the master clock frequency;
   (B) selecting divider values for one of the plurality of tiers of dividers subject to a requirement that input frequencies to that tier of dividers fall within a predetermined range and that they add a minimum number of few new factors to the LCM;
   (C) multiplying the LCM by any new factors needed to realize the dividers of the selected tier of dividers to yield a new LCM as LumpLCM;
   (D) determining an integer p such that p*LumpLCM falls within an allowable range of the reference frequency;
   (E) computing the reference frequency as the product p*LumpLCM; and
   (F) programming a test program for automatic test equipment, responsive to at least one of the divider values, to produce the plurality of clock signals when the test program is run.

10. A method as recited in claim 9, further comprising:
    repeating steps B and C for all except the last tier of dividers, including updating LumpLCM for each repetition to include any new factors needed to realize the dividers for the respective tier.

11. A method as recited in claim 9, further comprising:
    computing values for the last tier of dividers responsive to LumpLCM and the reference frequency.

12. A method as recited in claim 11, further comprising:
    computing the K multiplier as the reference frequency divided by the master clock frequency.

13. A method as recited in claim 12, wherein the reference frequency is defined as a product of a master clock frequency and a fixed K multiplier.

14. A method operable on a clocking system that includes a plurality of tiers of clock dividers that successively divide a fixed reference frequency for producing a plurality of clock signals having desired frequencies, the reference frequency being defined as a product of a master clock and a multiplier K, the method comprising:
    (A) determining a least common multiple (LCM) of the desired frequencies and the master clock frequency;
    (B) determining a least common multiple (BigLCM) of the desired frequencies and the fixed reference frequency;

(C) selecting divider values for one of the plurality of tiers of dividers subject to a requirement that input frequencies to that tier fall within a predetermined range and that they add a minimum number of few new factors to BigLCM;

(D) multiplying the LCM by any new factors needed to realize the dividers of the selected tier of dividers to yield a LumpLCM;

(E) determining a real number n such that n*LumpLCM equals the reference frequency;

(F) rounding n to the nearest integer to yield $n_r$;

(G) modifying the desired frequencies by a factor $n_r/n$ to account for rounding errors introduced in step F; and (H) programming a test program for automatic test equipment, responsive to at least one of the divider values, to produce the plurality of clock signals when the test program is run.

15. A method as recited in claim 14, wherein the number of tiers of dividers is two.

16. A method as recited in claim 14, further comprising, prior to step A, attributing at least two of the desired frequencies to a coherency group, and performing steps A–G using only the desired frequencies attributed to the coherency group.

17. A method as recited in claim 16, further comprising performing steps A–G independently for different coherency groups.

18. A method as recited in claim 17, wherein coherency groups are user-assignable.

19. A method as recited in claim 14, wherein the tier of dividers selected in step C is the tier of dividers whose output produces the desired frequencies.

* * * * *